(12) United States Patent
Kimura et al.

(10) Patent No.: US 6,548,035 B1
(45) Date of Patent: Apr. 15, 2003

(54) SILICON SINGLE CRYSTAL WAFER FOR EPITAXIAL WAFER, EPITAXIAL WAFER, AND METHODS FOR PRODUCING THE SAME AND EVALUATING THE SAME

(75) Inventors: Akihiro Kimura, Gunma (JP); Makoto Iida, Gunma (JP); Yoshinori Hayamizu, Gunma (JP); Ken Aihara, Gunma (JP); Masanori Kimura, Gunma (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 09/868,058
(22) PCT Filed: Oct. 5, 2000
(86) PCT No.: PCT/JP00/06965
§ 371 (c)(1), (2), (4) Date: Jun. 14, 2001
(87) PCT Pub. No.: WO01/27362
PCT Pub. Date: Apr. 19, 2001

(30) Foreign Application Priority Data

Oct. 15, 1999 (JP) ............................................. 11-294523

(51) Int. Cl.$^7$ ............................................. A01N 43/40
(52) U.S. Cl. ..................... 423/328.2; 117/13; 117/19; 117/20
(58) Field of Search ................... 117/19, 20; 423/328.2

(56) References Cited

U.S. PATENT DOCUMENTS 6,197,109 B1 * 3/2001 Iida et al. ..................... 117/19
6,261,361 B1 * 7/2001 Iida et al. ..................... 117/19

FOREIGN PATENT DOCUMENTS

| JP | A 60-251190 | 12/1985 |
| JP | A 11-189493 | 7/1999 |

OTHER PUBLICATIONS

Iida et al., "Effects of light element impurities on the formation of grown–in defects free region of czochralski silicon single crystal", Electrochemical Society Proceedings, vol. 99–1, 1999, pp. 499–510.

* cited by examiner

Primary Examiner—Felisa Hiteshew
(74) Attorney, Agent, or Firm—Oliff & Berridge, PLC

(57) ABSTRACT

A silicon single crystal wafer for epitaxial growth grown by the CZ method, which is doped with nitrogen and has a V-rich region over its entire plane, or doped with nitrogen, has an OSF region in its plane, and shows an LEP density of 20/cm$^2$ or less or an OSF density of $1 \times 10^4$/cm$^2$ or less in the OSF region, epitaxial wafer utilizing the substrate, as well as methods for producing them and method for evaluating a substrate suitable for an epitaxial wafer. There are provided a substrate for an epitaxial wafer that suppresses crystal defects to be generated in an epitaxial layer when epitaxial growth is performed on a CZ silicon single crystal wafer doped with nitrogen and also has superior IG ability, epitaxial wafer utilizing the substrate, as well as methods for producing them and method for evaluating a substrate suitable for an epitaxial wafer.

29 Claims, 8 Drawing Sheets

FIG. 3
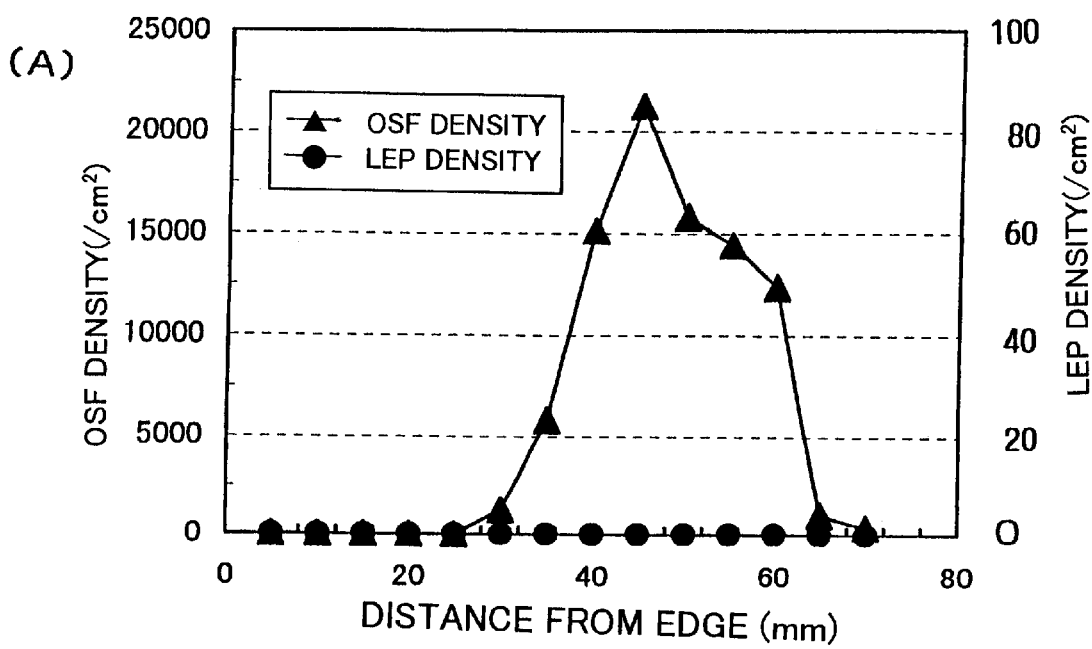
(A) WITHOUT NITROGEN DOPING
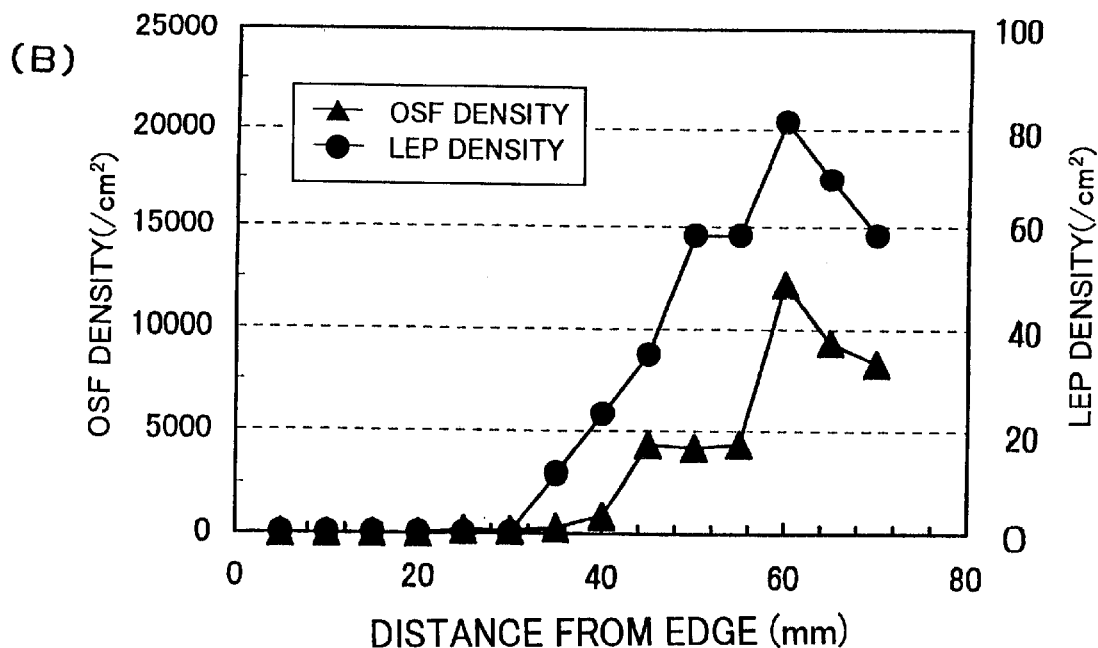
(B) NITROGEN $\geq 1 \times 10^{14}/cm^3$ FIG. 4
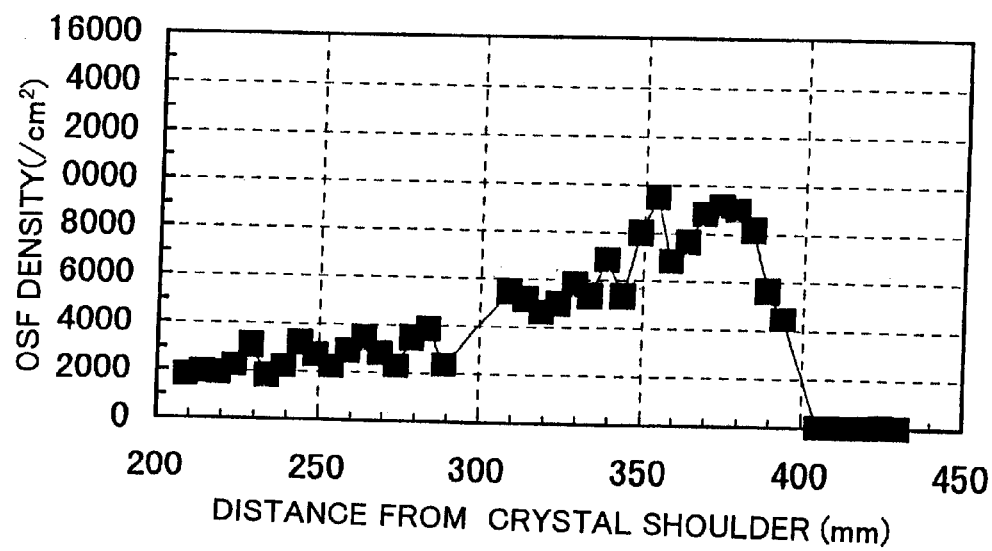
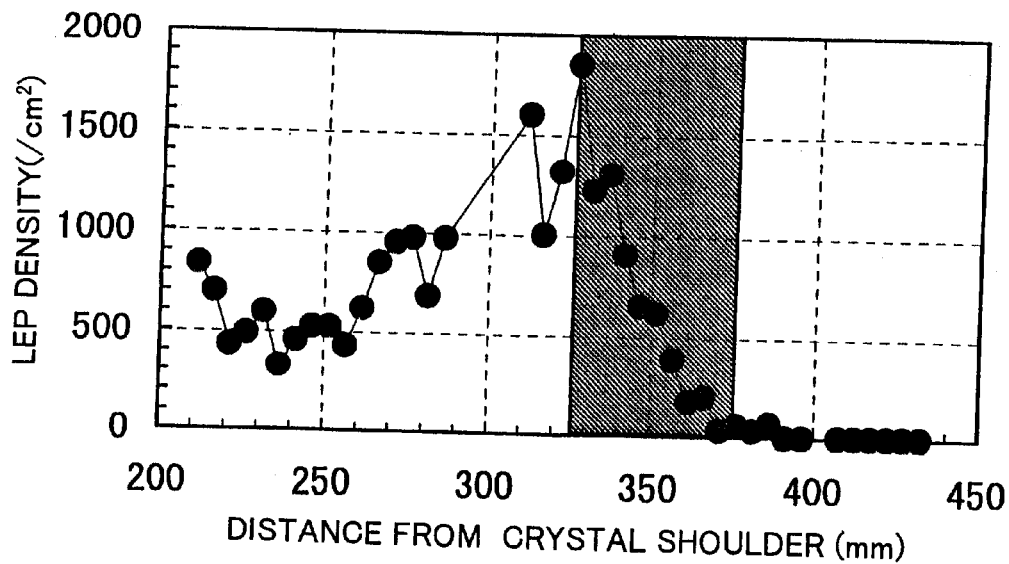

FIG. 5
NITROGEN CONCENTRATION: $1.2 \times 10^{14}/cm^3$
(A)
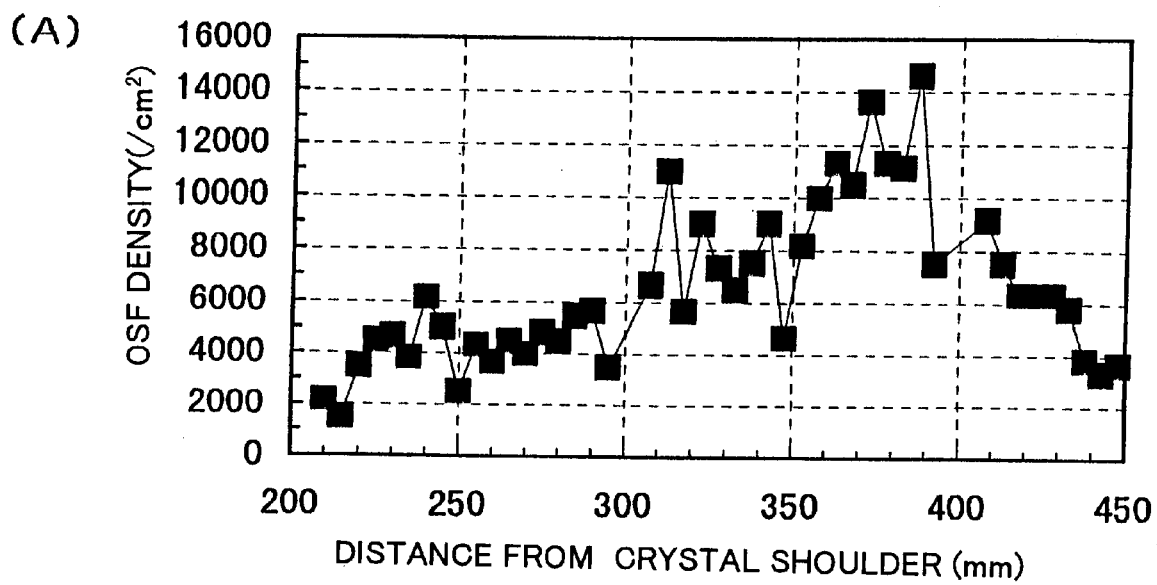
(B)
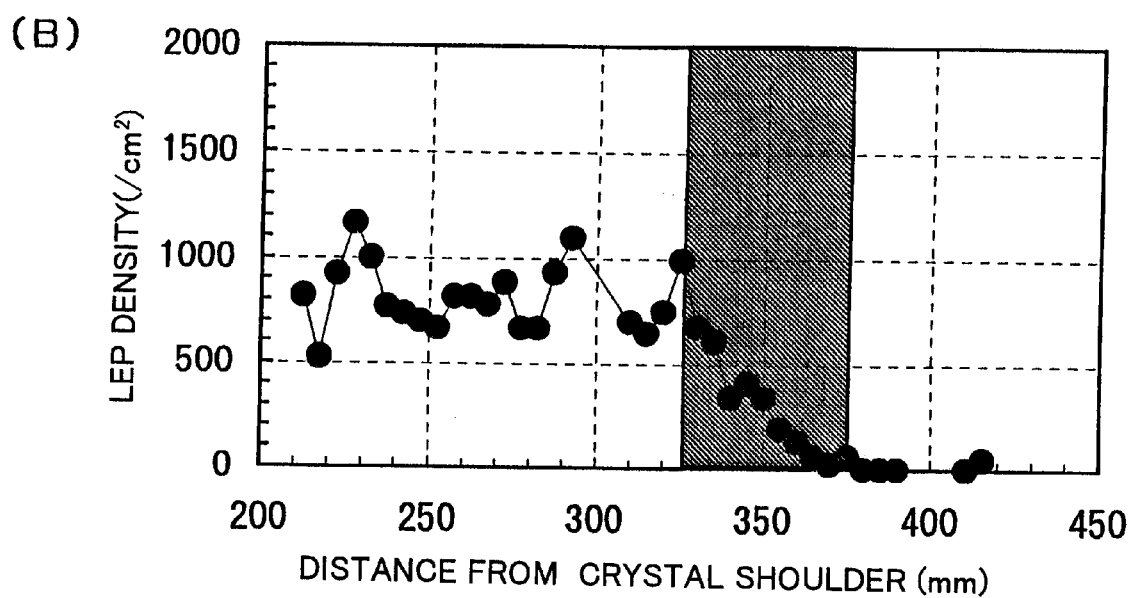

SILICON SINGLE CRYSTAL WAFER FOR EPITAXIAL WAFER, EPITAXIAL WAFER, AND METHODS FOR PRODUCING THE SAME AND EVALUATING THE SAME

THIS APPLICATION IS A 371 FO PCT/JP00/06965/ Oct. 5, 2000.

TECHNICAL FIELD

The present invention relates to a silicon single crystal wafer suitable for a substrate of epitaxial wafer used in fabrication of semiconductor devices and an epitaxial wafer utilizing it, as well as methods for producing them, and the present invention further relates to a method for evaluating a silicon single crystal wafer suitable for a substrate of epitaxial wafer.

BACKGROUND ART

It is well known that grown-in defects existing in CZ silicon single crystals pulled by the Czochralski method (CZ method) degrade oxide dielectric breakdown voltage characteristics of wafers, cause isolation failures in the device production step and so forth, and various methods are proposed to obviate such problems.

For example, there are a method of reducing grown-in defects during the pulling by the CZ method, a method of eliminating surface defects by subjecting a wafer to annealing at high temperature in a hydrogen or argon atmosphere, a method of using an epitaxial wafer in which an epitaxial layer is grown, and so forth.

Further, as the integration degree of semiconductor devices becomes higher in recent years, it is becoming more important to reduce crystal defects in semiconductors, in particular, crystal defects on and near surfaces thereof. For this reason, the demand for epitaxial wafers in which an epitaxial layer excellent in crystallinity is formed on a wafer surface increases every year.

Meanwhile, when devices are produced by using an epitaxial wafer, various heat treatment steps are usually used in addition to the epitaxial growth. If contaminations such as heavy metal impurities are present during these steps, they will markedly degrade device characteristics. Therefore, such contaminants must be eliminated from the epitaxial layer as much as possible. Accordingly, a substrate having high gettering effect is required as a substrate for the epitaxial growth.

Gettering includes extrinsic gettering (EG) and intrinsic gettering (IG). As typical EG techniques, there are technique of polysilicon back seal in which a polysilicon film is deposited on a back surface of substrate, technique of mechanically damaging the back surface and so forth. However, not only these techniques suffer from problems of particle generation and so forth, but also they are extremely disadvantageous in view of cost since they require special process steps.

On the other hand, in IG, a CZ method silicon wafer containing oxygen is subjected to a heat treatment to generate oxide precipitates that become gettering sites in a bulk portion of substrate. However, in the case of an epitaxial wafer, it suffers from a problem that oxide precipitate nuclei originally existing in a substrate are eliminated during the epitaxial growth at a high temperature, and gettering ability becomes insufficient because oxide precipitates are not likely to be formed and to grow during the subsequent device heat treatment.

Therefore, the conventional production of epitaxial wafers utilizes the fact that a substrate containing boron at a high concentration ($p^+$ substrate) has the gettering effect, that is, there is often used a $p^-/p^+$ epitaxial wafer, in which an epitaxial layer of low boron concentration ($p^-$) is formed on a $p^+$ substrate. However, when epitaxial growth is performed on a $p^+$ substrate, there are caused a problem of autodoping, in which boron doped at a high concentration is evaporated from the substrate and taken up into the epitaxial layer during the epitaxial growth, or a problem that boron is taken up from the substrate surface into the epitaxial layer due to solid phase out-diffusion. Further, since demand for epitaxial wafers utilizing $p^-$ substrates is increasing in recent years for CMOS devices, insufficient gettering ability becomes to constitute a problem.

Furthermore, fairly recently, there is frequently seer effective use of techniques utilizing characteristics of crystals doped with nitrogen as methods for obtaining CZ wafers having reduced grown-in defects existing near wafer surfaces. For example, there can be mentioned a technique in which defects in a deeper region are eliminated through annealing by doping nitrogen into crystals to make a size of grown-in void defects smaller in order to enhance easiness of elimination of defects during the annealing at a high temperature, a technique of producing epitaxial wafers showing enhanced IG ability by using crystals doped with nitrogen for substrates of the epitaxial wafers so as to enhance formation of oxide precipitates during the device heat treatment and thus increase BMDs (Bulk Micro Defects) and so forth.

As an example of use of such nitrogen-doped crystals for substrates for epitaxial growth, in the technique described in Japanese Patent Laid-open (Kokai) Publication No. 11-189493, a silicon single crystal grown with doping of nitrogen at a level of $10^{13}$ atoms/cm$^3$ or more is used for epitaxial wafers. This technique was based on the finding that, if an epitaxial layer was formed on a substrate containing an OSF (Oxidation induced Stacking Fault) region, which was generated in a ring shape depending on the pulling conditions of single crystal in the CZ method, oxygen precipitation nuclei existing in the OSF ring region were not eliminated, but they functioned as effective gettering sites in the device production process after the epitaxial formation, and the finding that the width of the OSF ring could be made larger by doping nitrogen during the single crystal growth, and if the amount of nitrogen to be doped was $10^{13}$ atoms/cm$^3$ or more, the nuclei of OSFs effective for the gettering could be uniformly distributed over the whole single crystal.

However, according to the investigation of the inventors of the present invention, it became clear that, if an epitaxial layer was formed on a wafer doped with nitrogen, defects called LPDs (Light Point Defects, generic term for referring to bright spot defects observed by using a wafer surface analysis apparatus utilizing laser light), which were harmful to devices, were likely to be formed on the OSF region of the epitaxial layer. Further, it was also found that these LPDs were particularly notably observed, when the nitrogen concentration was high. That is, if an epitaxial layer is formed utilizing the technique described in the aforementioned Japanese Patent Laid-open (Kokai) Publication No. 11-189493 as it is, there are likely to be obtained an epitaxial wafer in which many LPDs are generated. Therefore, as a countermeasure for this, decrease in nitrogen concentration is contemplated. However, the decrease in nitrogen concentration results in reduction of two of the intrinsic effects of doping with nitrogen, that is, the reduction in void size, i.e., improvement effect of elimination efficiency of defects by the annealing, and the improvement effect of IG ability brought by the enhancement of oxygen precipitation.

DISCLOSURE OF THE INVENTION

The present invention was accomplished in view of the aforementioned problems, and its object is to provide a substrate for an epitaxial wafer that suppresses crystal defects to be generated in an epitaxial layer when epitaxial growth is performed on a CZ silicon single crystal wafer doped with nitrogen and also has superior IG ability and an epitaxial wafer utilizing such a substrate, as well as methods for producing them. Further, another object of the present invention is to provide a method for evaluating such a substrate suitable for an epitaxial wafer.

In order to achieve the aforementioned objects, the present invention provides a silicon single crystal wafer for epitaxial growth grown by the CZ method, which is doped with nitrogen and has a V-rich region over its entire plane.

Such a silicon single crystal wafer as described above, which is obtained by processing a silicon single crystal ingot doped with nitrogen in the CZ method and has a V-rich region over its entire plane, can suppress crystal defects to be generated in the epitaxial layer during the epitaxial growth, and moreover, it can be a silicon single crystal wafer having a superior IG ability and suitable for epitaxial growth. Therefore, the influences on the device production can be substantially eliminated, and it can be a silicon single crystal wafer that can improve production yield or quality characteristics of devices.

The present invention also provides a silicon single crystal wafer for epitaxial growth grown by the CZ method, which is doped with nitrogen, has an OSF region in its plane, and shows an LEP density of $20/cm^2$ or less in the OSF region.

The present invention further provides a silicon single crystal wafer for epitaxial growth grown by the CZ method, which is doped with nitrogen, has an OSF region in its plane, and shows an OSF density of $1 \times 10^4/cm^2$ or less in the OSF region.

In such wafers, generation of LPD can be suppressed when an epitaxial layer is formed on the wafer.

In the aforementioned wafers, the nitrogen concentration is preferably $2 \times 10^{13}/cm^3$ to $1 \times 10^{14}/cm^3$.

If the nitrogen concentration is $2 \times 10^{13}/cm^3$ or more as described above, sufficient BMDs can be obtained even after an epitaxial layer is formed, and they act as effective gettering sites in the device production process. Further, if the nitrogen concentration is $1 \times 10^{14}/cm^3$ or less, the generation of LPDs in the epitaxial layer can be effectively inhibited.

The present invention also provides an epitaxial wafer in which an epitaxial layer is formed on a surface of any one of the silicon single crystal wafers mentioned above.

If an epitaxial layer is formed on a surface of a silicon single crystal wafer in which crystal defects are controlled as described above, a silicon epitaxial wafer of high quality can be obtained, which has very few LPDS, BMDs of sufficient density in a bulk portion of the substrate by the effect of nitrogen doping, and hence superior gettering ability. Therefore, it can be a silicon epitaxial wafer in which IG ability is enhanced by promoting the formation of oxide precipitates during the device heat treatment to increase BMDs.

The present invention further provides an epitaxial wafer, which has $1 \times 10^8/cm^3$ or more of BMDs in a silicon single crystal wafer which is doped with nitrogen and on which an epitaxial layer is formed and a defect density of $0.11/cm^2$ (20/wafer having a diameter of 6 inches) or less on an epitaxial layer surface for defects having a size of 0.11 μm or more.

The present invention also provides a method for producing a silicon single crystal wafer for epitaxial growth, wherein, when a silicon single crystal doped with nitrogen is grown by the Czochralski method, the crystal is pulled under such a condition that the crystal should have a V-rich region for entire plane of the crystal.

If a silicon single crystal is pulled with nitrogen doping under such a condition that the crystal should have a V-rich region for entire plane of the crystal as described above, a wide control range and ease of control can be attained, and the crystal can be grown at a high speed. Therefore, silicon single crystal wafers for epitaxial growth can be produced with high yield while maintaining high productivity.

In the aforementioned method, as such a condition that the crystal should have a V-rich region for entire plane of the crystal, specifically, V/G (V: pulling rate [mm/min], G: temperature gradient along the direction of crystal growth in the vicinity of solid-liquid interface [° C./mm]) during the crystal growth is desirably controlled so that the OSF region should be eliminated from a peripheral portion of the crystal toward the outside.

The present invention also provides a method for producing a silicon single crystal wafer for epitaxial growth, wherein, when a silicon single crystal doped with nitrogen is grown by the Czochralski method, the crystal is pulled so that a center portion of the crystal should become a V-rich region and a peripheral portion of the crystal should become an OSF region, and then the OSF region is eliminated.

Even if the OSF region is not completely eliminated as described above, silicon single crystal wafers suitable for epitaxial growth can be produced by suppressing the generation of OSF by a position at a distance of about 20 mm from the periphery of the crystal toward the center, and removing this region in a subsequent processing of the single crystal ingot.

In these methods, a cooling rate within the temperature region of 1000° C. to 900° C. during the crystal growth is preferably adjusted to be 0.8° C./min or less.

Further, when the silicon single crystal doped with nitrogen is grown by the Czochralski method, the crystal can be pulled so that a center portion of the crystal should become a V-rich region and the crystal should have an OSF region, and a cooling rate of 0.8° C./min or less can be used within the temperature region of 1000° C. to 900° C.

When a crystal having an OSF region is used considering production cost and so forth, if slow cooling is used around the temperature region of 1000° C. to 900° C. as described above, although the density of OSFs is not changed, the morphology of the OSF nuclei can be changed to inhibit LEPs (Large Etch Pits) to be generated at the positions of OSF in the nitrogen doped crystal, and as a result the generation of LPDs in the epitaxial layer can be prevented.

The present invention further provides a method for producing a silicon single crystal wafer suitable for epitaxial growth, which comprises subjecting a silicon single crystal wafer produced by the aforementioned production methods to an IG heat treatment.

If a silicon single crystal wafer in which crystal defects are controlled before forming an epitaxial layer is subjected to the so-called IG heat treatment as described above, a DZ layer to be formed on the surface of substrate can be more deeply formed by the effect of nitrogen doping compared with a case not utilizing the nitrogen doping. Therefore, the wafer becomes more preferred one for devices and extremely good crystallinity of the epitaxial layer formed on its surface can be obtained.

The present invention further provides a method for producing an epitaxial wafer, wherein an epitaxial layer is formed on a surface of silicon single crystal wafer produced by the aforementioned production methods.

By such a method, there can be produced an epitaxial wafer which has an epitaxial layer of high quality without crystal defects and has enhanced IG ability due to increased BMDs.

Furthermore, the present invention also provides a method for evaluating a silicon single crystal wafer for an epitaxial wafer, wherein wafers are sliced from both ends of a silicon single crystal ingot produced by the Czochralski method with nitrogen doping, and both of the wafers are subjected to preferential etching and then density of LEPs generated on the wafer surfaces is measured, or both of the wafers are subjected to thermal oxidation treatment and then preferential etching and density of OSFs generated on the wafer surfaces is measured, so as to evaluate presence or absence of generation of crystal defects on a surface of epitaxial layer to be grown on a silicon single crystal wafer produced from a remaining portion of the silicon single crystal ingot from which the both wafers were sliced.

If a silicon single crystal wafer for an epitaxial wafer is evaluated as described above, it becomes possible to evaluate the quality at a point before processing of the wafer, and hence processing and epitaxial growth using a defective wafer can be prevented. Therefore, the cost can be markedly improved as the whole process.

As explained above, according to the present invention, silicon single crystal wafers suitable for epitaxial growth can be stably produced with high yield and high productivity by pulling a single crystal with nitrogen doping under such a condition that the crystal should have a V-rich region for entire plane of the crystal, or such a condition that the crystal should have an OSF region in its plane and the region should have a low crystal defect density. Furthermore, if an epitaxial layer is formed on a surface of such a silicon single crystal wafer, there can be easily produced silicon epitaxial wafer having suppressed crystal defects in the layer, and IG ability enhanced by promoting the formation of oxide precipitates during the device heat treatment to increase BMDs.

BRIEF EXPLANATION OF THE DRAWINGS

FIGS. 3(A) and (B) are graphs showing relationship between OSF density and LEP density for crystals having an OSF ring and pulled with or without nitrogen doping.

FIGS. 4(A) and (B) are graphs showing relationship between OSF density or LEP density and a distance from a shoulder of crystal for single crystal ingots pulled with nitrogen doping (low concentration).

FIGS. 5(A) and (B) are graphs showing relationship between OSF density or LEP density and a distance from a shoulder of crystal for single crystal ingots pulled with nitrogen doping (high concentration).

BEST MODE FOR CARRYING OUT THE INVENTION

Hereafter, embodiments of the present invention will be explained in detail with reference to the drawings. However, prior to the explanation, the relationship between pulling conditions of CZ crystals and grown-in defect regions will be explained.

First, it is known that point defects introduced into CZ silicon single crystals during the pulling of the crystals include atomic vacancy (vacancy) and interstitial silicon (interstitial-Si), and densities of these point defects are determined by the relationship (V/G) of the pulling rate of crystal, V (growth rate), and the temperature gradient in the vicinity of solid-liquid interface of crystal, G. In a silicon single crystal, a region into which vacancies have been predominantly introduced is called V-rich region, and there are many grown-in defects of void type due to lack of silicon atoms. On the other hand, a region into which interstitial silicons have been predominantly introduced is called I-rich region, and there are many defects of dislocation clusters and so forth due to the dislocations generated by the presence of excessive silicon atoms.

Further, it is also known that an N-region (neutral region) is present between the V-rich region and the I-rich region, in which lack or excess of the atoms is little. Further, presence of a region in which oxidation-induced stacking faults (abbreviated as "OSFs" hereinafter) are generated in a ring shape, i.e., OSF region (also called OSF ring region or ring OSF region), was also confirmed in the N-region.

Figure 8:
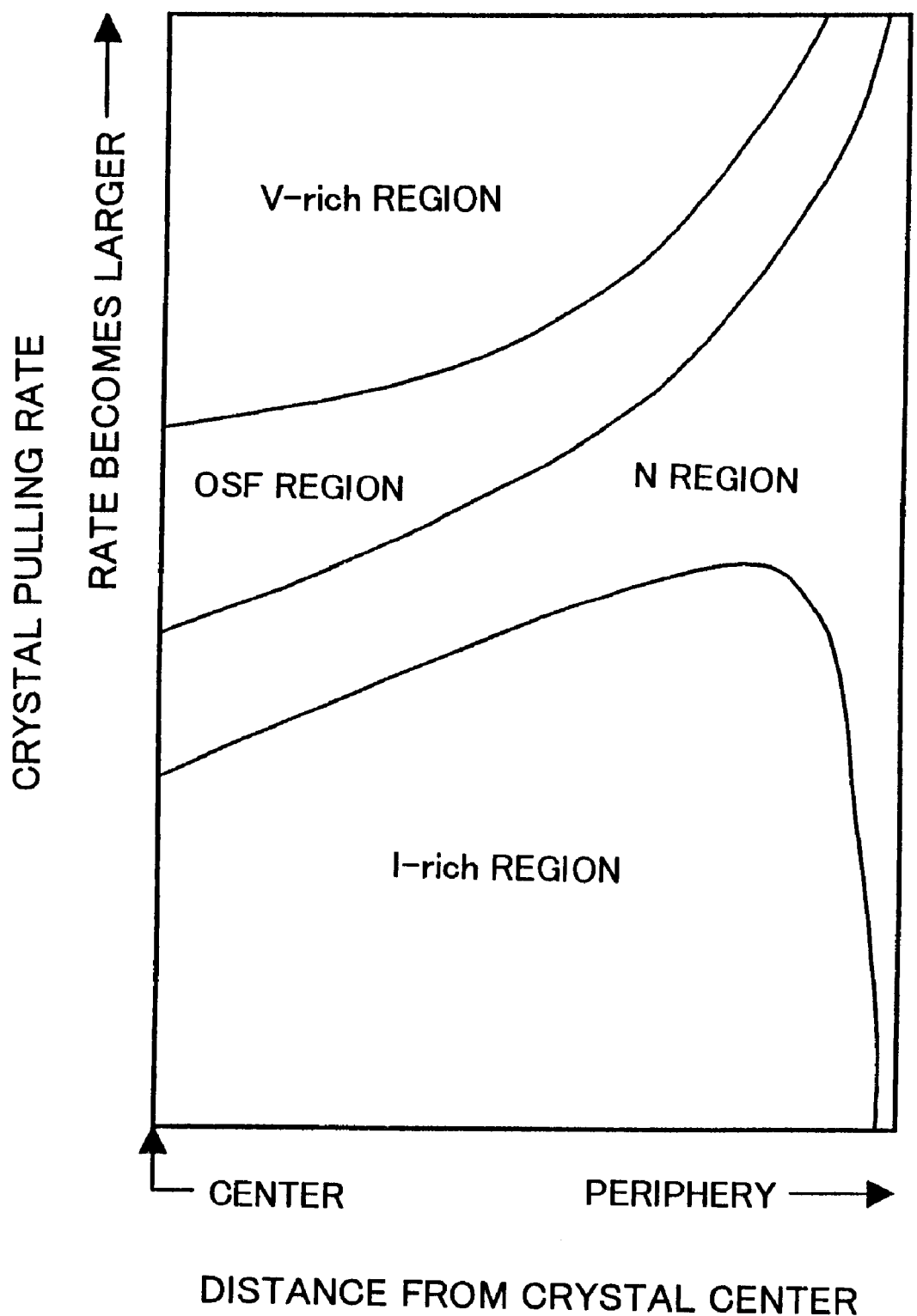
FIG. 8 is a chart showing distribution of grown-in defect regions for a crystal not doped with nitrogen, in which the horizontal axis indicates position in the crystal along the radial direction and the vertical axis indicates pulling rate of the crystal.

FIG. 8 schematically shows distribution of grown-in defect regions for a crystal not doped with nitrogen, in which the vertical axis indicates pulling rate of the crystal and the horizontal axis indicates a distance from the center of the crystal. This distribution pattern of the defect regions can be changed by controlling V/G through control of conditions for crystal pulling, furnace internal structure of crystal pulling apparatus (hot zone, HZ) and so forth.

As seen from FIG. 8, in general, when the crystal pulling rate is increased, the OSF region moves to the peripheral side of the crystal and thereafter disappears from the peripheral portion of the crystal, and thus a crystal having the V-rich region for the entire plane is obtained. On the contrary, if the pulling rate is decreased, the OSF region moves to the center side of the crystal and thereafter disappears at the center of the crystal, and thus a crystal becomes to have the I-rich region for the entire plane by way of the N-region.

It was reported that nitrogen doping changed width of the OSF region or the N-region or positions of boarders of the regions (Iida et al., 46th Conference of the Union of Subsidiaries of the Japan Society of Applied Physics, Extended Abstracts No. 1, p.471, 29aZB-9, 1999, Spring). Therefore, if the OSF region is desired to be controlled in a nitrogen-doped crystal, such control can be attained by referring to this relationship between V/G and the defect region distribution during the crystal growth with nitrogen doping.

The inventors of the present invention assiduously studied the relationship between LPDs, which are likely to be generated when an epitaxial layer is formed on a nitrogen-doped wafer, and defect regions (distribution of grown-in defects) of a silicon single crystal wafer on which the epitaxial layer is formed (henceforth referred to simply as "substrate"). As a result, they obtained the following novel findings, and accomplished the present invention.

(1) Relationship Between LPD and OSF Density

First, epitaxial growth was performed on a substrate doped with nitrogen. Then, the epitaxial layer surface was subjected to preferential etching, and portions corresponding to LPDs immediately after the formation of the epitaxial layer were observed by using an optical microscope, in order to investigate the entity of LPDs generated on the epitaxial layer surface. As a result, it was found that there were mainly dislocation loops and epi stacking faults (abbreviated as "SFs" hereinafter), and these could be distinguishably observed as LPDs of different sizes (those having a smaller size were dislocation loops and those having a larger size were SFs) if the observation was performed by using a wafer surface analysis apparatus utilizing laser light after preferential etching.

Furthermore, it was experimentally confirmed that these dislocation loops were generated only in the OSF ring region of the substrate, and they related to the OSF density.

FIGS. 1(A) to (D) shows relationship between a region in which dislocation loops were generated in an epitaxial layer (hatched area in the figure) and OSF density of substrate after the epitaxial growth for four of substrates having different nitrogen concentrations. As for the measurement of OSF density, a wafer having the same specifications as the above four substrates but not undergoing epitaxial growth was subjected to a thermal oxidation treatment at 1150° C. for 100 minutes and then preferential etching, and number of OSFs was counted by using an optical microscope to calculate the OSF density. This FIG. 1 shows that dislocation loops were generated in only regions having an OSF density of 10000/cm$^2$ or more.

(2) Relationship Between LPD and LEP

Figure 1:
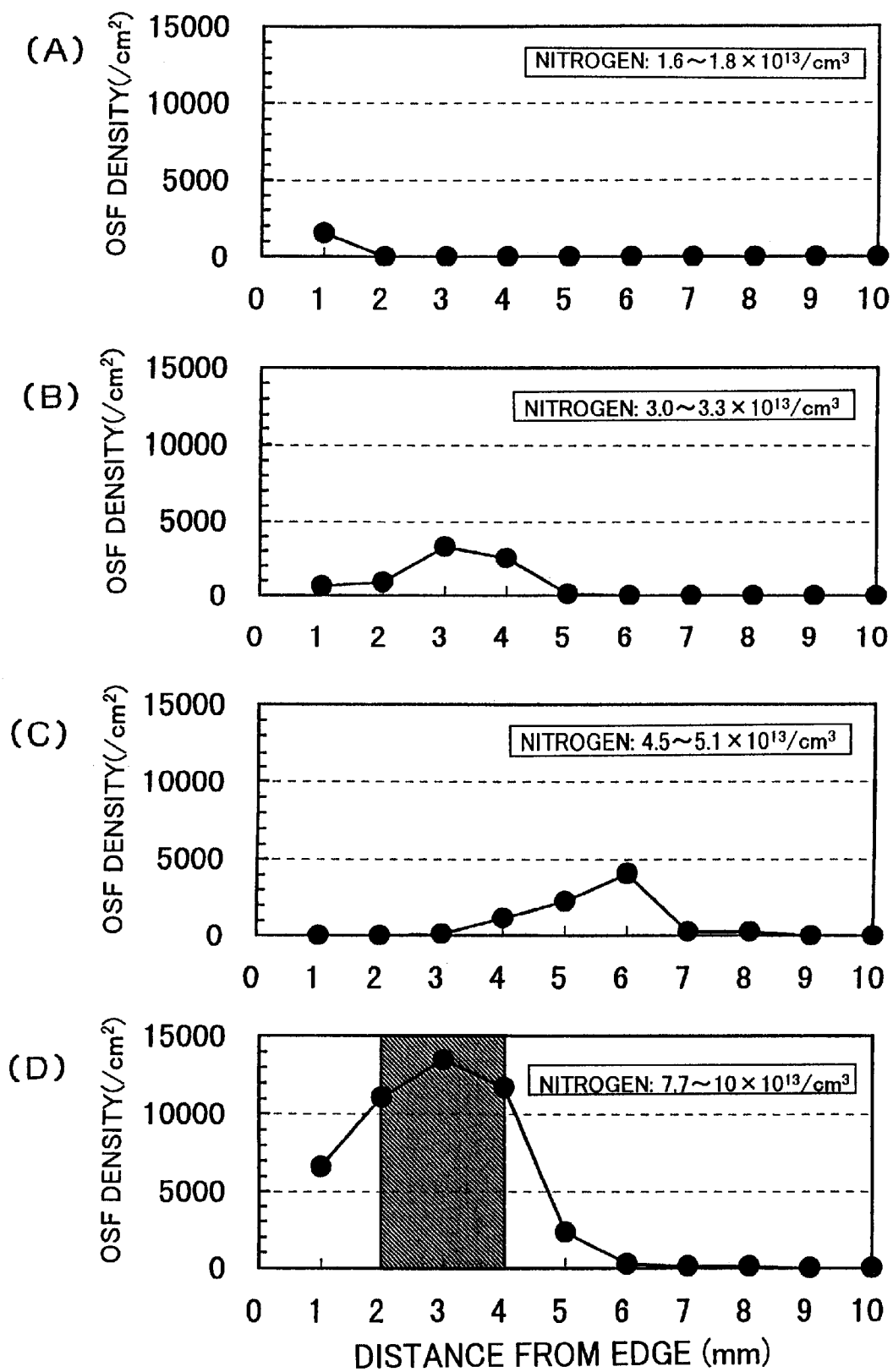
FIGS. 1(A) to (D) are graphs showing relationship between a region in which dislocation loops are generated in an epitaxial layer (hatched area in the figure) after the epitaxial growth and OSF density of substrate for four of substrates having different nitrogen concentrations.
Figure 2:
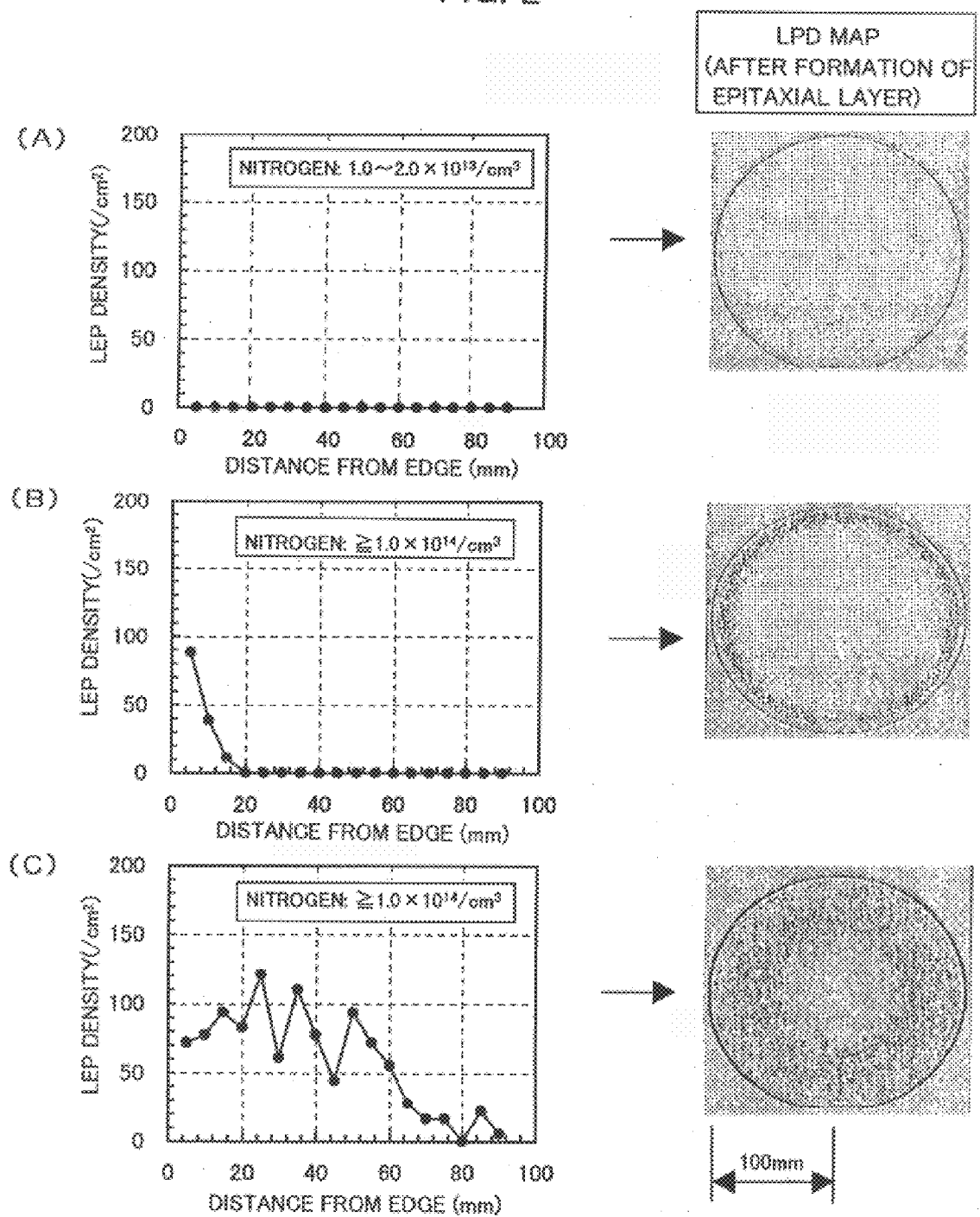
FIGS. 2(A) to (C) are graphs showing relationship between distribution of LPDs generated on a surface of an epitaxial layer after the epitaxial growth and LEP density of substrate for three of substrates having different nitrogen concentrations.

A crystal doped with nitrogen contains etch pits (Large Etch Pits, abbreviated as "LEPs" hereinafter) considered as dislocation clusters in peripheral portions of the crystal and so forth after the Secco etching, in spite of the fact that it is pulled at a relatively high pulling rate that usually does not generate dislocation clusters. It was confirmed by another experiment that, if an epitaxial layer is formed by using such a substrate, LPDs were generated in a region in which LEPs existed (see FIGS. 2(A) to (C)).

It was also confirmed in the same experiment that LPDs were not generated on the surface of epitaxial layer in a region in which the LEP deinsity is 20/cm$^2$ or less, even though there were LEPS.

Furthermore, since LEPs tended to be observed in the OSF ring region, relationship between OSF and LEP was investigated separately for each of crystals having an OSF ring pulled with or without nitrogen doping. As a result, as shown in FIGS. 3(A) to (B), in a crystal not doped with nitrogen, LEPs were not generated even if the OSF density was high. However, in a crystal doped with nitrogen, LEPs were generated at a high density in an area of relatively high OSF density among the areas where OSFs were generated. That is, it was found that these LEPs were defects peculiar to a nitrogen-doped crystal.

Then, conditions for controlling LEPs were examined. First, in order to investigate influence of thermal history during the crystal growth on the generation of LEPs, crystals were grown with nitrogen doping at a level of $3.9 \times 10^{13}$ [/cm$^3$] or $1.2 \times 10^{14}$ [/cm$^3$]. These nitrogen concentrations were values calculated for a position of shoulder of pulled crystals, and were calculated from amounts of wafers having a silicon nitride film introduced into the raw material polycrystal silicon and the segregation coefficient of nitrogen (0.0007). Further, in the pulling of these crystals, an experiment for sudden change of pulling rate was performed, in which a crystal was grown at a growth rate of 1.0 [mm/min] by a position of 50 cm from the shoulder, and then the pulling rate was suddenly decreased to 0.4 [mm/min] at the position of 50 cm to change the thermal history of the crystal. As a result, it was confirmed that, in both of the crystals, the LEP density sharply decreased at about 1000° C. to 900° C. (at a position of 32.5–37.5 cm from the shoulder of crystal), and the density was decreased from about 20/cm$^2$, which was considered a lower limit for the generation of LPDs in the epitaxial layer, to substantially 0/cm$^2$ (FIGS. 4(A) to B and 5(A) to (B)).

That is, it was found that LEPs to be generated at the positions of OSFs of nitrogen-doped crystal could be suppressed by slowly cooling the crystal within the temperature region of about 1000 to 900° C. And it was derived that the cooling rate could be about 0.8 [° C./min] or less from calculation based on the fact that the temperature region of about 100° C. corresponded to a crystal length of 50 mm and the crystal was pulled at a pulling rate of 0.4 mm/min for that length. As for the mechanism of such suppression of LEPs, it was considered to be caused by change of OSF nucleus morphology due to the slow cooling around 1000 to 900° C.

From the facts described in the above (1) and (2), it can be seen that the OSF ring region of substrate closely relates to LPDs to be generated in an epitaxial layer. Therefore, the inventors of the present invention conceived use of a substrate in which the OSF ring region that is the cause of the generation of LPDs was completely eliminated as a substrate in which LPDs would not be generated. Furthermore, they also conceived that, even if the OSF ring partially existed, LPDs could be reduced by suppressing the OSF density to a level of 10000/cm$^2$ or less or suppressing the LEP density to a level of 20/cm$^2$ or less in that region, and accomplished the present invention.

Now, LEP will be explained. As described above, LEPs are defects having a large size originated from dislocation clusters, and they are mainly constituted by LFPDs (Large Flow Pattern Defects) and LSEPDs (Large Secco Etch Pit Defects).

Among FPDs showing flow patterns when the Secco etching is performed, LFPDs refer to those having an etch pit at the end of the flow pattern in a size of 10 μm or more. On the other hand, among SEPDs not showing flow pattern when the Secco etching is performed, LSEPDs refer to those having an etch pit of a size of 10 μm or more.

(3) Relationship Between LPD and Nitrogen Concentration

Figure 6:
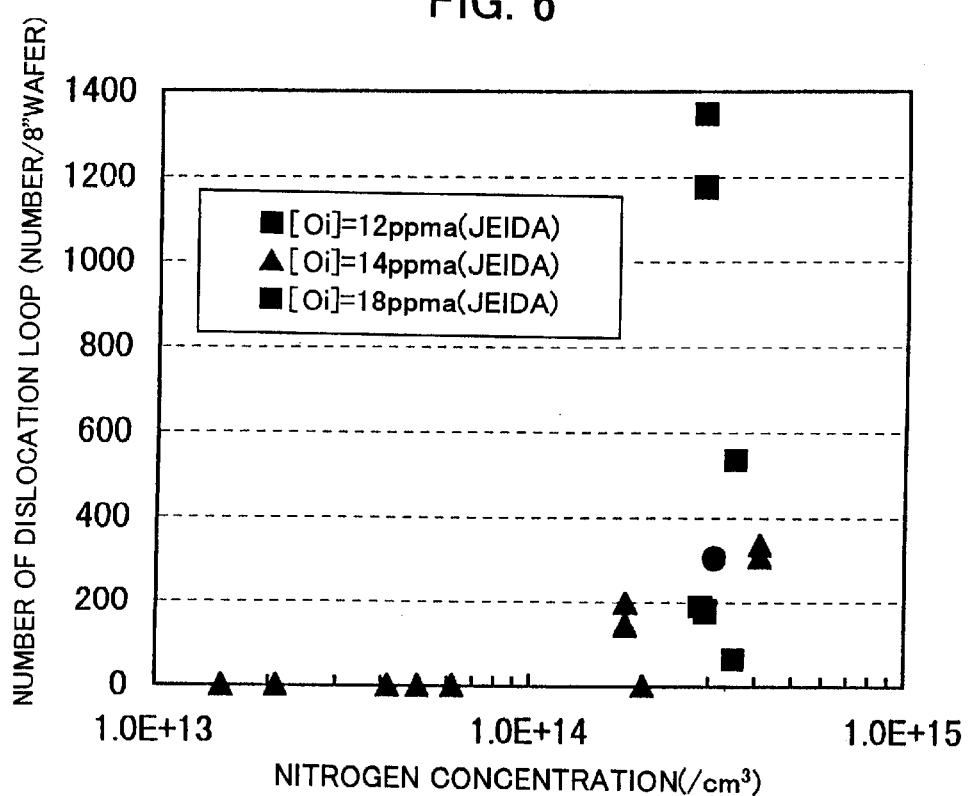
FIG. 6 is a graph showing relationship between nitrogen concentration of wafer and number of dislocation loops (LPDs) on an epitaxial layer surface.
Figure 7:
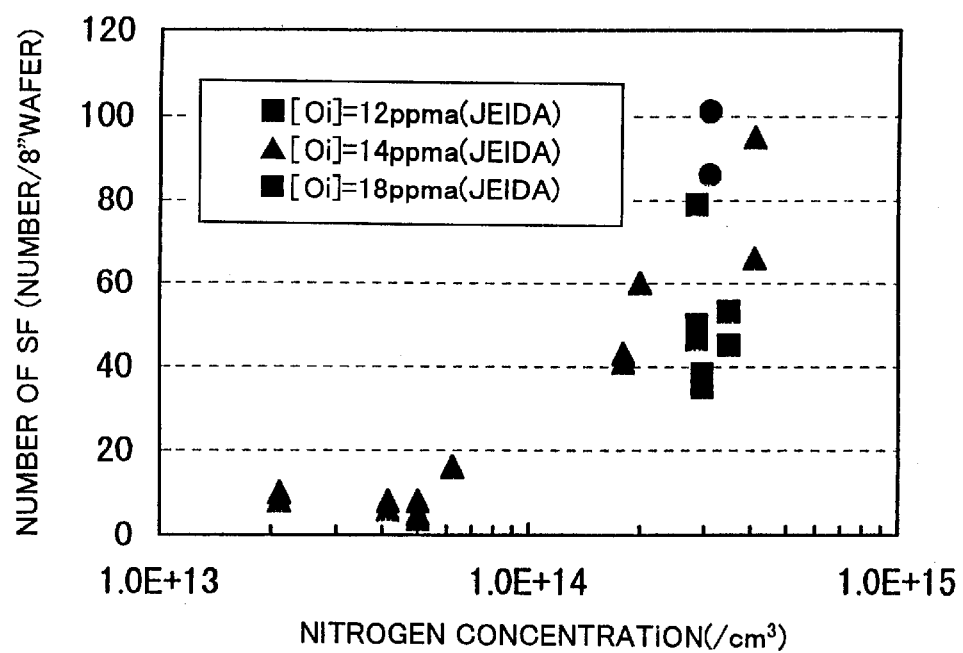
FIG. 7 is a graph showing relationship between nitrogen concentration of wafer and number of SFs (LPDs) on an epitaxial layer surface.

The inventors of the present invention further investigated the relationship between nitrogen concentration of substrate and LPDs (dislocation loop and SF) observed on an epitaxial layer surface. FIGS. 6 and 7 represent the relationship between dislocation loop or SF and nitrogen concentration, respectively. As the oxygen concentration of substrate, three kinds of concentrations, 12, 14 and 18 ppma (JEIDA standard: Japan Electronic Industry Development Association standard), were used. It can be seen that, as for both of the defects, the number of defects sharply increased when the nitrogen concentration of substrate exceeded $1\times10^{14}/cm^3$. The substrates used here were those produced from crystals pulled with a cooling rate of about 2.0° C./min, without performing the treatment for decreasing LEPs by using the slow cooling for the temperature region of 1000 to 900° C. explained in the above (2).

Figure 9:
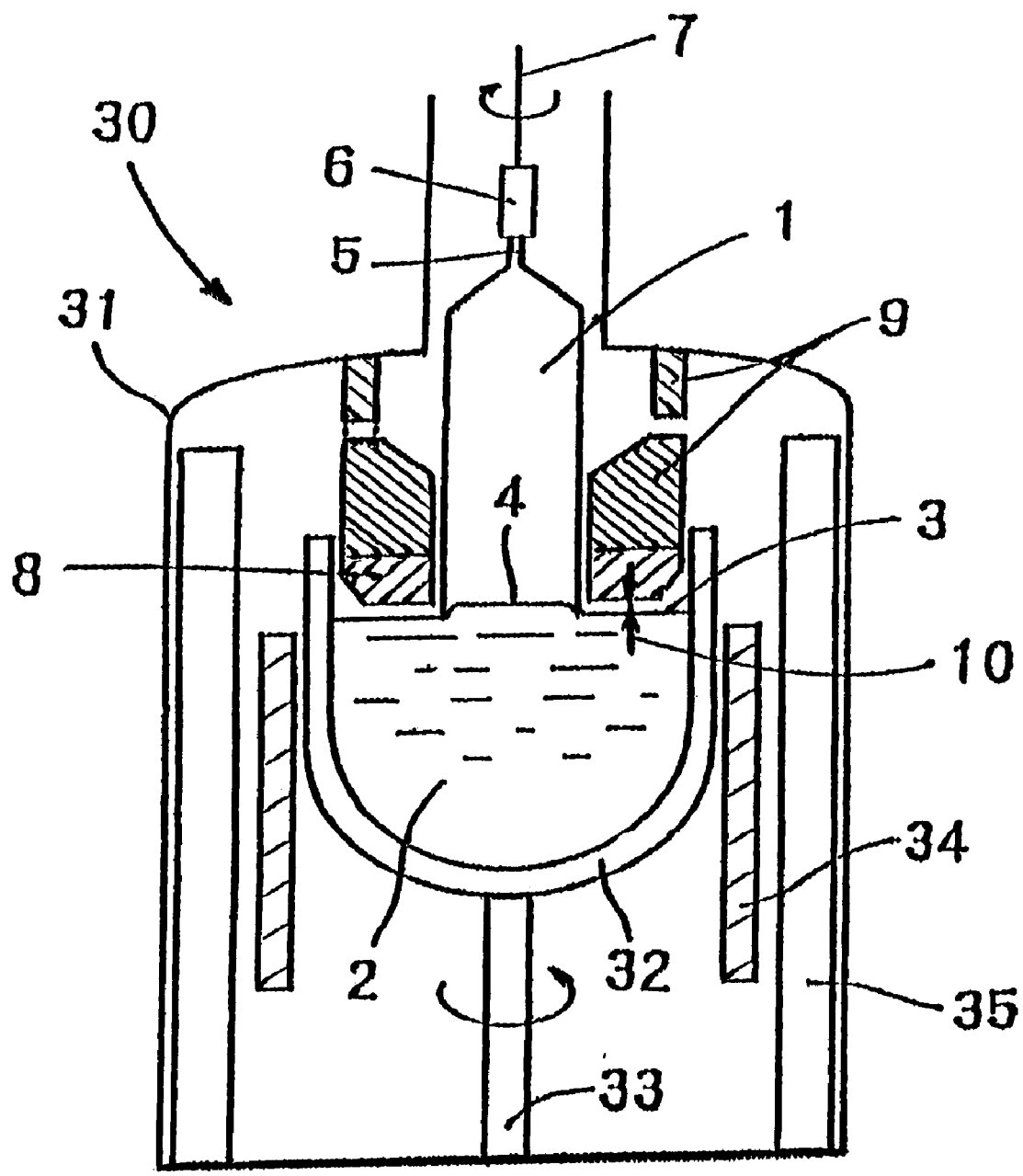
FIG. 9 is a schematic view showing a single crystal pulling apparatus based on the CZ method used in the present invention.

An exemplary structure of apparatus for pulling a single crystal by the CZ method used in the present invention will be explained hereafter by referring to FIG. 9. As shown in FIG. 9, the apparatus 30 for pulling a single crystal is constituted by a pulling chamber 31, crucible 32 provided in the pulling chamber 31, heater 34 disposed around the crucible 32, crucible-holding shaft 33 for rotating the crucible 32 and rotation mechanism therefor (not shown in the figure), seed chuck 6 for holding a silicon seed crystal 5, wire 7 for pulling the seed chuck 6, and winding mechanism (not shown in the figure) for rotating or winding the wire 7. The crucible 32 is composed of an inner quartz crucible for accommodating a silicon melt (molten metal) 2, and an outer graphite crucible. Further, a heat insulating material 35 surrounds the outside of the heater 34.

Further, in order to establish production conditions used for the production methods of the present invention, an annular solid-liquid interface heat insulating material 8 is provided around the periphery of the solid-liquid interface of the crystal, and an upper surrounding heat insulating material 9 is provided thereon. This solid-liquid interface heat insulating material 8 is provided so as to form a gap 10 of 3 to 5 cm between its lower end and the surface of silicon melt 2. The upper surrounding heat insulating material 9 may not be used depending on the conditions. Further, a cylindrical cooling apparatus not shown in the figure may be provided for cooling the single crystal by blowing cooling gas or shielding the radiant heat.

As another method, the so-called MCZ method is recently often used, in which a non-illustrated magnet is additionally installed outside the pulling chamber 31 in the horizontal direction, and a horizontal or vertical magnetic field is applied on the silicon melt 2 so as to prevent convection of the melt and realize stable growth of a single crystal.

A silicon single crystal doped with nitrogen can be grown by using the aforementioned apparatus 30 for pulling a single crystal according to a known method, for example, the method disclosed in Japanese Patent Laid-open (Kokai) Publication No. 60-251190. That is, first, a silicon polycrystal raw material of high purity is melted in the crucible 32 by heating it to a temperature higher than the melting point (about 1420° C.). At this point, silicon wafers having a nitride film, for example, are introduced, or an atmosphere containing nitrogen is used as the atmospheric gas, in order to dope nitrogen. Then, a tip end of the seed crystal 5 is brought into contact with, or immersed into the surface of the melt 2 at its approximate center portion by reeling out the wire 7. Subsequently, the crucible-holding shaft 33 is rotated in an optional direction, and at the same time the seed crystal 5 is pulled upwardly by winding up the wire 7 with rotating the wire to start the growing of single crystal. Thereafter, a single crystal ingot 1 approximately in a cylindrical shape can be obtained by suitably controlling the pulling rate and temperature. Further, the nitrogen concentration in the pulled single crystal can be calculated by using the amount of nitride introduced into the raw material polycrystal silicon and the segregation coefficient of nitrogen (0.0007).

In order to produce a substrate suitable for epitaxial growth according to the present invention, the crystal can be pulled so that the OSF region should be eliminated and the crystal should have the V-rich region for the entire plane by controlling V/G (V [mm/min] is pulling rate, and G [°C./mm] is temperature gradient of crystal) during the pulling of crystal. Further, even if the OSF region is not completely eliminated, a crystal having V-rich region for the entire plane can be obtained by growing the crystal so that the generation of the OSF region should be limited only for a portion of about 20 mm from the outer periphery of the crystal, and removing this portion at the time of subsequent processing of the single crystal ingot.

In this operation, as for the condition for pulling the crystal so that the entire plane should become V-rich region, basically, the V/G value during the pulling of crystal can be increased. Specifically, the condition can be achieved by setting the value at a level higher by at least about 0.02 [mm$^2$/° C.·min] than the value at which the OSF region disappears at the periphery of the crystal.

Further, in order to obtain the V-rich region for the entire crystal plane, the V/G value must be made high over the whole region along the radial direction of the crystal. When a usual hot zone (HZ) is used, G becomes higher at the peripheral side of the crystal. Therefore, V/G tends to become low in a peripheral portion of crystal. Accordingly, it is practical to slightly increase the pulling rate with using HZ that can lower G at the peripheral side.

If only the elimination of the OSF region is intended, it is also possible to pull a crystal so that it should have the I-rich region for the entire plane. However, it is not preferred, because many dislocation clusters are generated in the I-rich region and cause LPDs after the epitaxial growth, and in addition, the decrease of the pulling rate degrades the productivity. Besides producing a crystal having the V-rich region for the entire plane, it is also possible to obtain an LEP density in the OSF region of 20/cm$^2$ or less by pulling a crystal under such a condition that the OSF region should be contained with slowly cooling the crystal at a cooling rate of 0.8° C./min or less for the temperature region of 1000 to 900° C., or to obtain an OSF density of $1\times10^4/cm^2$ or less by using conventional control and so forth for reducing the oxygen concentration such as reduction of crucible rotation number and reduction of atmospheric pressure. The slow cooling for the temperature region of about 1000 to 900° C. can also be used for a crystal having the V-rich region for the entire plane, and the generation of LEPs can be more effectively suppressed by pulling a crystal so that the crystal should have the V-rich region for the entire plane while using the aforementioned control.

A silicon single crystal wafer suitable for epitaxial growth can be obtained by wafer processing in a conventional manner using a single crystal ingot pulled under such a condition as described above.

When an epitaxial layer is formed on a silicon single crystal wafer produced from a single crystal ingot pulled by utilizing the aforementioned findings, the following evaluation method can be used as a method of inspecting whether an epitaxial wafer in which LPDs are not generated can be obtained or not before the wafer processing.

That is, it is possible that wafers (or slabs) are sliced from both ends of a silicon single crystal ingot, and both of the wafers are subjected to preferential etching and density of LEPs generated on the wafer surfaces is measured, or both of the wafers are subjected to thermal oxidation treatment and then preferential etching and density of OSFs generated on the wafer surfaces is measured, so as to evaluate presence or absence of generation of crystal defects on a surface of epitaxial layer to be grown on a silicon single crystal wafer produced from a remaining portion of the silicon single crystal ingot from which the both wafers were sliced.

Specifically, for example, a block having a length of about 20 cm is cut out from a silicon single crystal ingot. Slabs having a thickness of about 2 mm are sliced from the both ends of the block, and subjected to a thermal oxidation treatment at 1150° C. for 100 minutes. Then, the slabs were subjected to preferential etching to etch them for a thickness of about 5 μm. Thereafter, bright spots are observed under a collimated light, and a region having bright spots is observed along the radial direction by using an optical microscope.

Since it is already known that epitaxial defects would not be generated in a region having an OSF density of 10000/cm$^2$ or less, if the OSF density is 10000/cm$^2$ or less for the whole surfaces of the slabs of the both block ends, the block can be processed into wafers and epitaxial growth can be performed on them. Thus, it becomes possible to evaluate quality of wafers at a point before processing of wafers, and it becomes unnecessary to perform wafer processing and epitaxial growth using defective products. Therefore, yield and productivity of silicon single crystal wafers for epitaxial growth can be improved, and the cost can be markedly reduced.

If an epitaxial layer is formed by using such a silicon single crystal wafer produced as described above and suitable for epitaxial growth, there can be obtained a silicon epitaxial wafer of high quality having very few LPDs, BMDs at a sufficient density in a bulk portion of substrate by the effect of nitrogen doping, and superior gettering ability.

In this case, a substrate before the formation of epitaxial layer can be subjected to the so-called IG heat treatment. If the substrate is subjected to the IG heat treatment, a DZ (Denuded Zone) layer to be formed on the surface of substrate can be more deeply formed compared with a case without using nitrogen doping by the effect of the nitrogen doping, and therefore it can be a more preferable one for devices, and extremely good crystallinity of an epitaxial layer formed on the surface can be obtained.

Hereafter, the present invention will be explained with reference to the following specific examples and comparative examples. However, the present invention is not limited to these.

EXAMPLE 1

Wafer Having the V-rich Region for the Entire Plane

In the pulling apparatus 30 shown in FIG. 9, raw material polycrystal silicon was charged into a 20-inch quartz crucible, and a silicon single crystal of P-type for conductivity type having a diameter of 6 inches and orientation of <100> was pulled. The crucible rotation rate was 1 rpm, and the crystal rotation rate was 15 rpm. The crystal was grown at a pulling rate V of about 1.4 mm/min.

As for the HZ structure of the pulling apparatus, a structure of standard type providing G of 4.0 [° C./mm] at a peripheral portion of crystal was used. The values of G in the pulling apparatus used in the examples and the comparative examples mean temperature gradient from the melting point of silicon to 1400° C.

A nitrogen doping amount of $1 \times 10^{14}$/cm$^3$ was attained by introducing silicon wafers having a nitride film into the raw material polycrystal. The oxygen concentration was adjusted to 12 to 15 ppma (JEIDA). The crystal was pulled while controlling the V/G value at a crystal periphery portion to be about 0.35 mm$^2$/° C.·min. The cooling rate for the temperature region of 1000 to 900° C. was about 1.4° C./min.

From the single crystal ingot obtained above, a wafer was sliced and mirror-polished to produce a mirror-surface wafer of silicon single crystal, and OSF density and LEP density of the wafer were measured. Further, BMD and LPD were evaluated after formation of epitaxial layer.

(Evaluation Method for OSF Density)

A wafer was subjected to an oxidation heat treatment at 1150° C. for 100 minutes, and its surface was etched with a preferential etching solution of hydrofluoric acid and nitric acid type for a thickness of about 5 μm and observed by using an optical microscope.

(Evaluation Method for LEP Density)

After the Secco etching was performed for 30 minutes, observation was performed by using an optical microscope.

(Evaluation Method for BMD)

An epitaxial layer having a thickness of 3 μm was formed at 1125° C. and then subjected to heat treatments at 800° C. for 4 hours and at 1000° C. for 16 hours to grow oxygen precipitation nuclei to those having a detectable size. Then, measurement was performed by using an OPP (Optical Precipitate Profiler) apparatus produced by Bio-Rad Co.

(Evaluation Method for LPD)

An epitaxial layer having a thickness of 3 μm was formed at 1125° C., and then defects having a defect size of 0.11 μm or more were measured by using a surface measurement apparatus, SP1, produced by KLA/Tencor Co., Ltd.

The pulling conditions and the results of the evaluations mentioned above are summarized in Table 1.

TABLE 1

| | Example No. | | | | |
|---|---|---|---|---|---|
| Item | Example 1 V-rich region for entire plane | Example 2 With OSF region | Example 3 With OSF region, slow cooling | Comparative Example 1 With OSF region | Comparative Example 2 V-rich region for entire plane |
| HZ structure | Standard type | Standard type | Slow cooling type | Standard type | Standard type |
| Pulling rate V (mm/min) | 1.4 | 1.0 | 1.0 | 1.0 | 1.4 |
| V/G (mm$^2$/° C. · min) | 0.35 | 0.25 | 0.29 | 0.25 | 0.35 |
| Nitrogen concentration (/cm$^3$) | $1 \times 10^{14}$ | $2 \times 10^{13}$ | $8 \times 10^{13}$ | $8 \times 10^{13}$ | Without doping |

TABLE 1-continued

| Item | Example 1 V-rich region for entire plane | Example 2 With OSF region | Example 3 With OSF region, slow cooling | Comparative Example 1 With OSF region | Comparative Example 2 V-rich region for entire plane |
|---|---|---|---|---|---|
| Oxygen concentration (ppma, JEIDA) | 12–15 | 12–15 | 12–15 | 12–15 | 12–15 |
| Cooling rate for 1000–900° C. (° C./min) | 1.4 | 1.0 | 0.8 | 1.0 | 1.4 |
| OSF density (/cm$^2$) | 0 | 1000 in OSF region | 9000 in OSF region | 22000 in OSF region | 0 |
| LEP density (/cm$^2$) | 0 | $\leq$16.0 in OSF region | $\leq$8.0 in OSF region | 200 in OSF region | 0 |
| BMD after formation of epitaxial layer (/cm$^3$) | 2 × 10$^9$ | 1 × 10$^8$ | 8 × 10$^8$ | 4 × 10$^8$ | 10$^6$–10$^7$ |
| LPD on epitaxial layer surface (defects/ 6" wafer) | $\leq$20 | $\leq$20 | $\leq$20 | $\geq$500 | $\leq$20 |

EXAMPLE 2

Wafer Having V-rich Region for Center Portion of Wafer Plane, with OSF Ring Region, Low Nitrogen Concentration A crystal was pulled under the same conditions as in Example 1 except that a pulling rate V of about 1.0 mm/min, V/G value of about 0.25 mm$^2$/° C.·min and nitrogen doping amount of 2×10$^{13}$/cm$^3$ were used and a cooling rate of about 1.0° C./min was used for the temperature region of 1000 to 900° C.

The pulling conditions and evaluation results are also shown in Table 1.

EXAMPLE 3

Wafer Having V-rich Region for Center Portion of Wafer Plane, with OSF Ring Region, Using Slow Cooling for the Temperature Region of 1000 to 900° C.

A crystal was pulled under the same conditions as in Example 1 except that a heat insulating material was disposed where the crystal temperature has become around 1000 to 900° C. during the pulling, an HZ structure providing G of 3.5 [° C./mm] at a peripheral portion of the crystal (slow cooling type) was used, a pulling rate V of about 1.0 mm/min, V/G value of about 0.29 mm$^2$/° C.·min and nitrogen doping amount of 8×10$^{13}$/cm$^3$ were used and a cooling rate of about 0.8° C./min was used for the temperature region of 1000 to 900° C.

The pulling conditions and evaluation results are also shown in Table 1.

Comparative Example 1

Wafer Having V-rich Region for Center Portion of Wafer Plane, with OSF Ring Region, High Nitrogen Concentration A crystal was pulled under the same conditions as in Example 2 except that a nitrogen doping amount of 8×10$^{13}$/cm$^3$ was used.

The pulling conditions and evaluation results are also shown in Table 1.

Comparative Example 2

Wafer Having V-rich Region for Entire Wafer Plane, Without Nitrogen Doping

A crystal was pulled under the same conditions as in Example 1 except that nitrogen doping was not used.

The pulling conditions and evaluation results are also shown in Table 1.

From the results shown in Table 1, it was found that, according to the present invention, there can be obtained an epitaxial wafer having extremely few defects in an epitaxial layer, i.e., defect density of about 0.11/cm$^2$ (20/6-inch wafer) or less, and sufficient gettering effect by the presence of BMDs of 1×10$^8$/cm$^3$ or more.

The present invention is not limited to the embodiments described above. The above-described embodiments are mere examples, and those having the substantially same structure as that described in the appended claims and providing the similar functions and advantages are included in the scope of the present invention.

For example, the aforementioned embodiments were explained for cases where silicon single crystals having a diameter of 6 inches were grown. However, the present invention is not limited to them, and can also be applied to silicon single crystals having a diameter of 8–16 inches or larger.

Further, the present invention can of course be used for the so-called MCZ method in which a horizontal magnetic field, vertical magnetic field, cusp magnetic field or the like is applied to silicon melt.

What is claimed is:

1. A silicon single crystal wafer for epitaxial growth grown by the Czochralski method, which is doped with nitrogen and has a V-rich region over its entire plane.

2. The silicon single crystal wafer according to claim 1, wherein the nitrogen concentration is 2×10$^{13}$/cm$^3$ to 1×10$^{14}$/cm$^3$.

3. An epitaxial wafer having an epitaxial layer formed on a surface of the silicon single crystal wafer according to claim 1.

4. A silicon single crystal wafer for epitaxial growth grown by the Czochralski method, which is doped with nitrogen, has an OSF region in its plane, and shows an LEP density of 20/cm$^2$ or less in the OSF region.

5. The silicon single crystal wafer according to claim 4, wherein the nitrogen concentration is 2×10$^{13}$/cm$^3$ to 1×10$^{14}$/cm$^3$.

6. An epitaxial wafer having an epitaxial layer formed on a surface of the silicon single crystal wafer according to claim 4.

7. A silicon single crystal wafer for epitaxial growth grown by the Czochralski method, which is doped with nitrogen, has an OSF region in its plane, and shows an OSF density of 1×10$^4$/cm$^2$ or less in the OSF region.

8. The silicon single crystal wafer according to claim 7, wherein the nitrogen concentration is 2×10$^{13}$/cm$^3$ to 1×10$^{14}$/cm$^3$.

9. An epitaxial wafer having an epitaxial layer formed on a surface of the silicon single crystal wafer according to claim 7.

10. An epitaxial wafer, which has $1 \times 10^8/cm^3$ or more of BMDs in a silicon single crystal wafer which is doped with nitrogen and on which an epitaxial layer is formed and a defect density of $0.11/cm^2$ (20/wafer having a diameter of 6 inches) or less on an epitaxial layer surface.

11. A method for producing a silicon single crystal wafer for epitaxial growth, wherein, when a silicon single crystal doped with nitrogen is grown by the Czochralski method, the crystal is pulled under such a condition that the crystal should have a V-rich region for entire plane of the crystal.

12. The method for producing a silicon single crystal wafer for epitaxial growth according to claim 11, wherein, as such condition that the crystal should have a V-rich region for entire plane of the crystal, V/G (V: pulling rate, G: temperature gradient of crystal) during the crystal growth is controlled so that the OSF region should disappear from a peripheral portion of the crystal.

13. The method for producing a silicon single crystal wafer for epitaxial growth according to claim 12, wherein a cooling rate within the temperature region of 1000° C. to 900° C. during the crystal growth is adjusted to be 0.8° C./min or less.

14. A method for producing a silicon single crystal wafer for epitaxial growth, which comprises subjecting a silicon single crystal wafer produced by the production method according to claim 12 to an IG heat treatment.

15. A method for producing an epitaxial wafer, wherein an epitaxial layer is formed on a surface of silicon single crystal wafer produced by the production method according to claim 12.

16. The method for producing a silicon single crystal wafer for epitaxial growth according to claim 11, wherein a cooling rate within the temperature region of 1000° C. to 900° C. during the crystal growth is adjusted to be 0.8° C./min or less.

17. A method for producing a silicon single crystal wafer for epitaxial growth, which comprises subjecting a silicon single crystal wafer produced by the production method according to claim 11 to an IG heat treatment.

18. A method for producing an epitaxial wafer, wherein an epitaxial layer is formed on a surface of silicon single crystal wafer produced by the production method according to claim 17.

19. A method for producing an epitaxial wafer, wherein an epitaxial layer is formed on a surface of silicon single crystal wafer produced by the production method according to claim 11.

20. A method for producing a silicon single crystal wafer for epitaxial growth, wherein, when a silicon single crystal doped with nitrogen is grown by the Czochralski method, the crystal is pulled so that a center portion of the crystal should become a V-rich region and a peripheral portion of the crystal should become an OSF region, and then the OSF region is eliminated.

21. The method for producing a silicon single crystal wafer for epitaxial growth according to claim 20, wherein a cooling rate within the temperature region of 1000° C. to 900° C. during the crystal growth is adjusted to be 0.8° C./min or less.

22. A method for producing a silicon single crystal wafer for epitaxial growth, which comprises subjecting a silicon single crystal wafer produced by the production method according to claim 20 to an IG heat treatment.

23. A method for producing an epitaxial wafer, wherein an epitaxial layer is formed on a surface of silicon single crystal wafer produced by the production method according to claim 22.

24. A method for producing an epitaxial wafer, wherein an epitaxial layer is formed on a surface of silicon single crystal wafer produced by the production method according to claim 20.

25. A method for producing a silicon single crystal wafer for epitaxial growth, wherein, when the silicon single crystal doped with nitrogen is grown by the Czochralski method, the crystal is pulled so that a center portion of the crystal should become a V-rich region and the crystal should have an OSF region, and a cooling rate of 0.8° C./min or less is used within the temperature region of 1000° C. to 900° C.

26. A method for producing a silicon single crystal wafer for epitaxial growth, which comprises subjecting a silicon single crystal wafer produced by the production method according to claim 25 to an IG heat treatment.

27. A method for producing an epitaxial wafer, wherein an epitaxial layer is formed on a surface of silicon single crystal wafer produced by the production method according to claim 26.

28. A method for producing an epitaxial wafer, wherein an epitaxial layer is formed on a surface of silicon single crystal wafer produced by the production method according to claim 25.

29. A method for evaluating a silicon single crystal wafer for an epitaxial wafer, wherein wafers are sliced from both ends of a silicon single crystal ingot produced by the Czochralski method with nitrogen doping, and both of the wafers are subjected to preferential etching and then density of LEPs generated on the wafer surfaces is measured, or both of the wafers are subjected to a thermal oxidation treatment and then preferential etching and density of OSFs generated on the wafer surfaces is measured, so as to evaluate presence or absence of a generation of crystal defects on a surface of epitaxial layer to be grown on a silicon single crystal wafer produced from a remaining portion of the silicon single crystal ingot from which the both wafers were sliced.

* * * * *